(12) United States Patent
Shimuta et al.

(10) Patent No.: US 8,687,404 B2
(45) Date of Patent: Apr. 1, 2014

(54) MEMORY ELEMENT AND DRIVE METHOD FOR THE SAME, AND MEMORY DEVICE

(75) Inventors: Masayuki Shimuta, Kanagawa (JP); Jun Sumino, Kanagawa (JP); Shuichiro Yasuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 144 days.

(21) Appl. No.: 13/164,945

(22) Filed: Jun. 21, 2011

(65) Prior Publication Data

US 2012/0008369 A1    Jan. 12, 2012

(30) Foreign Application Priority Data

Jul. 6, 2010    (JP) .................................. 2010-153771

(51) Int. Cl.
*G11C 11/00*    (2006.01)

(52) U.S. Cl.
USPC ............................ 365/148; 365/145; 365/163

(58) Field of Classification Search
USPC ......................................... 365/148, 163, 145
See application file for complete search history.

(56) References Cited

U.S. PATENT DOCUMENTS

| 7,433,220 B2 * | 10/2008 | Shiimoto et al. ............... 365/145 |
| 2009/0279349 A1 * | 11/2009 | Shih et al. ..................... 365/163 |

FOREIGN PATENT DOCUMENTS

| JP | 2006-134954 | 5/2006 |
| JP | 2008-135659 | 6/2008 |

* cited by examiner

*Primary Examiner* — Toan Le
(74) *Attorney, Agent, or Firm* — Dentons US LLP

(57) ABSTRACT

A memory element capable of increasing capacity with an improvement of distribution of resistance in the high-resistance state, a drive method therefor, and a memory device are provided. The memory element includes first and second electrodes, and a plurality of resistance change elements electrically connected in series between the first and second electrodes, whose resistance values are reversibly changeable in response to application of a voltage to the first and second electrodes, and changeable to the same resistance state relative to the voltage application.

10 Claims, 9 Drawing Sheets

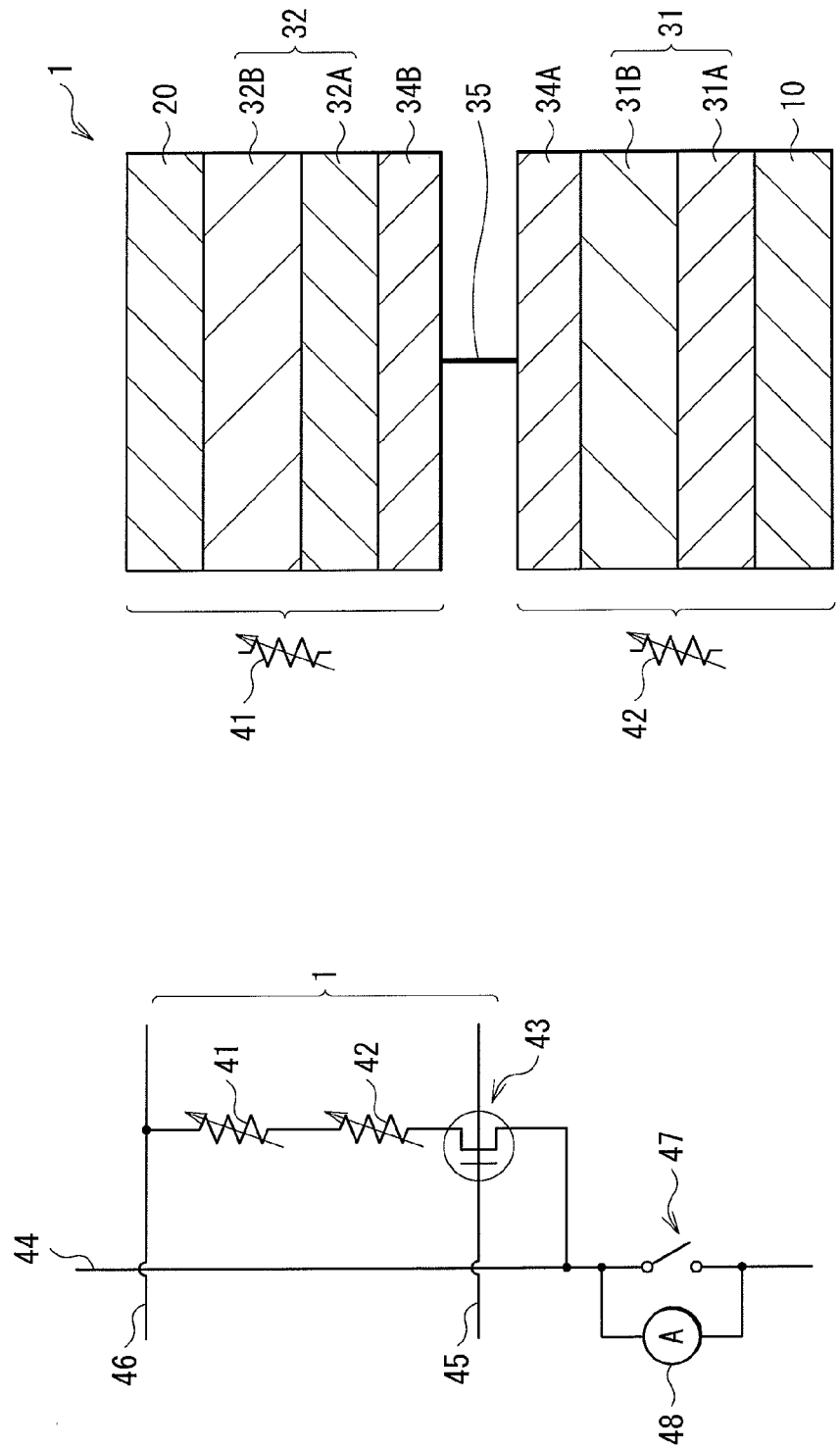

MEMORY ELEMENT AND DRIVE METHOD FOR THE SAME, AND MEMORY DEVICE

BACKGROUND

The present disclosure relates to a memory element capable of storing information in response to a change of electrical characteristics of a resistance change layer, to a drive method thereof, and to a memory device provided with this memory element.

In information equipment such as computer, as a random access memory, a high-density DRAM (Dynamic Random Access Memory) operating at a high speed has been widely used. As for the DRAM, however, the manufacturing process thereof is complicated compared with that of a general circuit used in electronic device, e.g., a logic circuit LSI (Large Scale Integrated circuit) and a signal processing circuit, and thus the manufacturing cost of the DRAM is high. Moreover, the DRAM is a volatile memory in which any written information is lost when the power is turned off, and there thus needs to perform a refresh operation frequently, i.e., an operation of reading any written information (data) therefrom, amplifying again the information, and writing again the information thereinto.

In consideration thereof, as a nonvolatile memory in which written information is not lost even if the power is turned off, previously proposed are flash memory, FeRAM (Ferroelectric Random Access Memory) (ferroelectric memory), MRAM (Magnetoresistive Random Access Memory) (magnetic memory element), and others. Such memories are capable of long-term storage of the written information without power supply. However, such memories each have advantages and disadvantages. That is, the flash memory is indeed high in degree of integration but is disadvantageous in terms of operation speed. The FeRAM has limitations in terms of microfabrication for a high integration degree, and has also a disadvantage of manufacturing process. The MRAM has a disadvantage of power consumption.

As such, as a next-generation nonvolatile memory, a memory element of a new type has been proposed, e.g., ReRAM (Resistive Random Access Memory) and PCM (Phase Change Memory) (for example, see Japanese Unexamined Patent Application Publication No. 2008-135659).

SUMMARY

However, with such an existing ReRAM, if it is left as it is for a long time, or if it is left as it is in an atmosphere with a temperature higher than the ambient temperature, this causes a phenomenon of resistance value change. For some PCM and ReRAM, one of the causes of such a phenomenon seems due to a conductive path formed by diffusion of atoms or ions by heat or an electric field, and any resistance change is brought about thereby. Considering an increasing capacity, the existing ReRAM causing such a resistance change is low in information retention capability, and the distribution of resistance in the high-resistance state is not adequate as the element characteristics used for a nonvolatile memory.

Japanese Unexamined Patent Application Publication No. 2006-134954 discloses a memory element including two resistance change elements connected in series. However, in Japanese Unexamined Patent Application Publication No. 2006-134954, these two resistance change elements are so configured as to each store complementary data, and the memory element thus still has the disadvantage described above, i.e., disadvantage of resistance change by heat and an electric field.

It is thus desirable to provide a memory element capable of increasing capacity with an improvement of distribution of resistance in the high-resistance state, a drive method therefor, and a memory device.

A memory element according to an embodiment of the present disclosure includes first and second electrodes, and a plurality of resistance change elements. The resistance change elements are electrically connected in series between the first and second electrodes, whose resistance values are reversibly changeable in response to application of a voltage to the first and second electrodes, and changeable to the same resistance state relative to the voltage application.

Herein, the expression of "a change to the same resistance state" means that the resistance change elements are all changed in state from low- to high-resistance or from high- to low-resistance.

A method of driving a memory element according to an embodiment of the present disclosure includes functioning a plurality of resistance change elements as a single element by decreasing or increasing all at once the resistance value of the resistance change elements by application of a voltage to first and second electrodes.

A memory device according to an embodiment of the present disclosure includes a plurality of memory elements, and a pulse application unit applying a voltage or current pulse selectively to the memory elements. In the memory device, the memory elements are each configured by the memory element according to the embodiment of the present disclosure described above.

With the memory element according to the embodiment of the present disclosure or with the memory device according to the embodiment of the present disclosure, or with the memory element drive method according to the embodiment of the present disclosure, a plurality of resistance change elements are electrically connected in series between the first and second electrodes, and all show a change to the same resistance state in response to application of a voltage. As such, based on the voltage application to the first and second electrodes, the resistance change elements are decreased (low-resistance state; state of writing) or increased (high-resistance stare; state of erasing) in resistance value all at once such that the resistance change elements operate as a single element.

Note that it is the issue of definition which of the writing and erasing operations is related to which of the state changes, i.e., low- or high-resistance. In this Specification, the low-resistance state is defined as the writing operation, and the high-resistance state is defined as the erasing operation.

Herein, the resistance change elements each show a phenomenon of resistance value change not only by the voltage application to the first and second electrodes described above but also by any other factors such as heat and electric field. Such an unexpected resistance value change occurs at random to each of the resistance change elements based on a certain probability distribution. Accordingly, when the resistance change elements share the same probability distribution of resistance value change, any of the resistance change element may show a large resistance value change but the remaining resistance change elements may show a small resistance value change. If this is the case, because the memory element has the electrical characteristics specified for a higher resistance value, the change of resistance values between the first and second electrodes is decreased. This thus improves the resistance distribution in the high-resistance state.

With the memory element according to the embodiment of the present disclosure or with the memory element drive method according to the embodiment of the present disclosure, or with the memory device according to the embodiment of the present disclosure, a plurality of resistance change elements are electrically connected in series between the first and second electrodes to change the resistance change elements into the same resistance state in response to the application of a voltage. As such, by decreasing or increasing the resistance values of the resistance change elements all at once by the voltage application, the resistance change elements become operable as a single element, and the resistance distribution in the high-resistance state may be possibly improved. This thus allows the improvement of the ability of information retention with a large number of bits, and allows the increase of the capacity.

BRIEF DESCRIPTION OF THE DRAWINGS

FIGS. 4A and 4B are circuit diagram and a cross-sectional view of the memory element of FIG. 3, showing the operation (current-voltage characteristics) thereof.

DETAILED DESCRIPTION OF THE PREFERRED EMBODIMENTS

Figure 1:
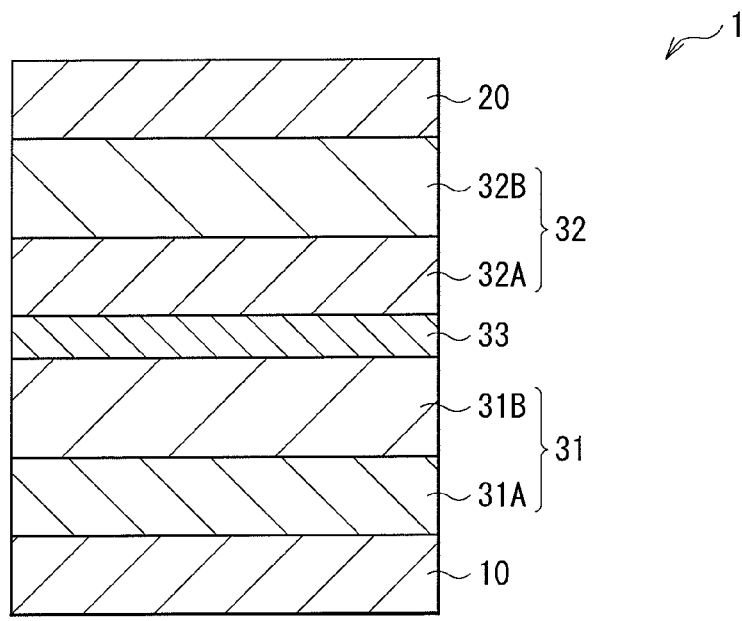
FIG. 1 is a cross-sectional view of a memory element in a first embodiment of the present disclosure, showing the configuration thereof.

In the below, embodiments of the present disclosure will be described in detail by referring to the accompanying drawings. Herein, the description is given in the following order.
1. First Embodiment (an example in which a resistance change element includes an ion source layer and a resistance change layer)
2. Second Embodiment (an example of PCM)
3. Third Embodiment (an example of ReRAM)
4. Memory device First Embodiment (Memory Element)
FIG. 1 is the cross-sectional view of a memory element 1 in a first embodiment of the present disclosure, showing the configuration thereof. This memory element 1 includes a plurality of (two in FIG. 1 example) resistance change elements 31 and 32 between a first electrode (lower electrode) 10 and a second electrode (upper electrode) 20. These resistance change elements 31 and 32 are electrically connected in series between the first and second electrodes 10 and 20. When a voltage is applied to the first and second electrodes 10 and 20, the resistance change elements 31 and 32 show a reversible change of resistance values, and show a change to the same resistance state relative to the voltage application. As such, this memory element 1 is allowed to be increased in capacity with an improvement of the distribution of resistance in the high-resistance state.

The resistance change element 31 is in the layered structure, including a resistance change layer 31A and an ion source layer 31B in this order from the first electrode 10 side, for example. The resistance change element 32 is also in the layered structure, including a resistance change layer 32A and an ion source layer 32B in this order from the first electrode 10 side, for example. That is, the resistance change elements 31 and 32 share the same layered structure in which the ion source layer, i.e., the ion source layer 31B or 32B, is disposed on the resistance change layer, i.e., the resistance change layer 31A or 32A. Although not shown, when the first electrode 10 is the upper electrode, and when the second electrode 20 is the lower electrode, the resistance change elements 31 and 32 have the layered structure of including the ion source layers 31B and 32B below the resistance change layers 31A and 32A, respectively.

Alternatively, as shown in FIG. 1, the resistance change elements 31 and 32 may be electrically connected in series with a diffusion prevention layer 33 disposed therebetween. The diffusion prevention layer 33 is configured by well-known barrier metals including Titanium Tungsten (TiW) or transition metals of nitride, boride, carbide, and silicide, for example.

Figure 2:
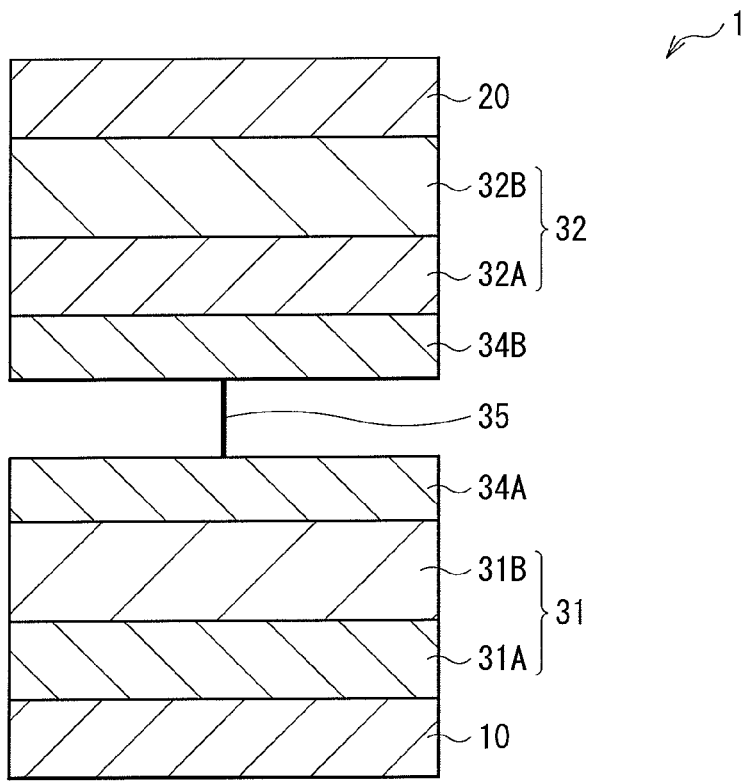
FIG. 2 is a cross-sectional view of a memory element in a modification.

Still alternatively, as shown in FIG. 2, the resistance change elements 31 and 32 may be electrically connected in series by intermediate electrodes 34A and 34B respectively provided thereto, and by a wiring 35 provided between the intermediate electrodes 34A and 34B. If this is the configuration, the resistance change elements 31 and 32 are not necessarily layered, and may be physically separated from each other, e.g., disposed at different positions on the same wafer.

The lower electrode 10 is provided on a silicon substrate (not shown) formed with a CMOS (Complementary Metal Oxide Semiconductor) circuit, for example, thereby serving as a connection section with the portion of the CMOS circuit. This lower electrode 10 is made of a material for wiring in the semiconductor process, e.g., tungsten (W), tungsten nitride (WN), titanium nitride (TiN), and tantalum nitride (TaN).

The ion source layers 31B and 32B each include, as an anionizing ion conducting material, a chalcogen element of at least any one of tellurium (Te), sulfur (S), and selenium (Se). Moreover, the ion source layers 31B and 32B each include a cationizable metallic element, e.g., zirconium (Zr) and/or copper (Cu), and also an element forming oxides during erasing, e.g., aluminum (Al) and/or germanium (Ge). To be specific, the ion source layers 31B and 32B are each made of a material for the ion source layer of composition such as ZrTeAl, ZrTeAlGe, CuZrTeAl, CuTeGe, and CuSiGe. Note that the ion source layers 31B and 32B may each include any element other than those described above, e.g., silicon (Si).

The resistance change layers 31A and 32A each serve as a barrier against electric conduction with a function of stabilizing the information retention characteristics. These resistance change layers 31A and 32A are each made of a material whose resistance value is higher than that of the ion source layers 31B and 32B. The resistance change layers 31A and 32A are each preferably made of a material such as oxides, nitrides, or others at least including one of rare-earth element such as Gd (gadolinium), and Al (aluminum), Mg (magnesium), Ta (tantalum), Si (silicon), and Cu (copper), for example.

The other components, i.e., the upper electrode 30, the intermediate electrodes 34A and 34B, and the wiring 35, are each made of a material similar to that of the lower electrode 10, i.e., a well-known material for wiring used in the semiconductor process.

Figure 3:
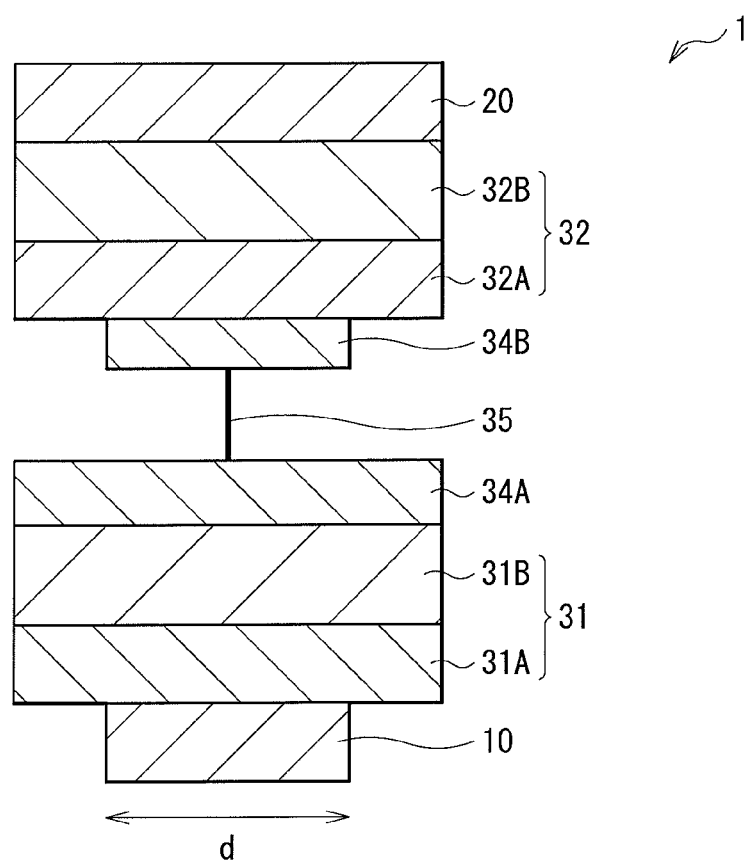
FIG. 3 is a cross-sectional view of a memory element in an Example of the present disclosure, showing the configuration thereof.

FIG. 3 is the cross-sectional view of the memory element 1 of FIG. 2, showing the specific configuration thereof. In this memory element 1, the two resistance change elements 31 and 32 are provided at different positions on the same wafer, and are electrically connected in series between the first and second electrodes 10 and 20 via the intermediate electrodes 34A and 34B and the wiring 35. In this memory element 1, the first electrode 10 and the intermediate electrode 34B are provided in the same layer, and the intermediate electrode 34A and the second electrode 20 are provided in the same layer.

To be specific, the first electrode 10 and the intermediate electrode 34B are each a conductive plug with the diameter of 100 nmφ, and are each made of titanium nitride (TiN), for example. The resistance change layers 31A and 32A each have the thickness of 1 mm, and are each made of gadolinium oxide (GdOx), for example. The ion source layers 31B and 32B each have the thickness of 60 nm, and are each made of CuZrTeAl, for example. The intermediate electrode 34A and the second electrode 20 are each made of tungsten (W), for example.

With such a memory element 1, when a voltage or current pulse is applied by a power source (pulse application unit; not shown) via the first and second electrodes 10 and 20, the resistance change elements 31 and 32 both show a change of the electrical characteristics, e.g., change of resistance values, thereby performing information writing, erasing, and reading. In the below, such an operation will be described specifically.

First of all, a positive voltage is applied to the memory element 1 such that the second electrode 20 is at a positive potential, and the first electrode 10 side is at a negative potential. In response thereto, in each of the resistance change elements 31 and 32, the conduction of cations such as copper (Cu) and/or zirconium (Zr) takes place from the ion source layers 31B and 32B, and the cations are deposited by bonding with electrons on the first electrode 10 side or the intermediate electrode 34B side. As a result, a conductive path (filament) is formed on the interface between the first electrode 10 and the resistance change layer 31A, and on the interface between the intermediate electrode 34B and the resistance change layer 32A. Such conductive paths are each made of low-resistance zirconium (Zr) and/or copper (Cu) after being reduced to metal. Alternatively, such a conductive path may be formed in each of the resistance change layers 31A and 32A. With the conductive paths formed as such, the resistance change layers 31A and 32A are both decreased in resistance value, and show a change of resistance state from high (initial state) to low.

Thereafter, even if the memory element 1 becomes free of voltage by removing the positive voltage, the low resistance state is kept. This means information writing is done. For use in a once-writable memory device, i.e., so-called PROM (Programmable Read Only Memory), the memory element 1 is completed with recording only by the process of recording described above.

On the other hand, for application use in an erasable memory device, i.e., RAM (Random Access Memory), EEPROM (Electronically Erasable and Programmable Read Only Memory), or others, a process of erasing is necessary. During the process of erasing, a negative voltage is applied to the memory element 1 such that the second electrode 20 is at a negative potential, and the first electrode 10 side is at a positive potential. In response thereto, in the conductive paths formed inside of the resistance change layers 31A and 31B, zirconium (Zr) and/or copper (Cu) is oxidized and ionized, and then is dissolved into the ion source layers 31B and 32B or is bonded to tellurium (Te) or others, thereby forming a compound such as $Cu_2Te$ or Cute. As a result, the conductive paths made of zirconium (Zr) and/or copper (Cu) disappear or are decreased, and the resistance values thus show an increase. Or an additive element such as aluminum (Al) or germanium (Ge) existing in the ion source layers 31B and 32B forms an oxide film on an anode electrode, and a change of resistance state thus occurs to be high.

Thereafter, even if the memory element 1 becomes free of voltage by removing the negative voltage, the resistance values remains high. This allows erasing of written information. By repeating such a procedure, the memory element 1 is to be subjected to repeated writing of information and erasing of the written information.

If the state high in resistance value is related to information of "0", and if the state low in resistance value is related to information of "1", for example, the information of "0" is to be changed to the information of "1" in the process of information recording by the application of a positive voltage, and the information of "1" is to be changed to the information of "0" in the process of information erasing by the application of a negative voltage.

For demodulation of recorded data, the larger ratio is more preferable between an initial resistance value and an after-recording resistance value. However, too large resistance values of the resistance change layers cause a difficulty in writing, i.e., in reducing the resistance. As a result, because a threshold voltage for writing is increased too much, the initial resistance value is preferably 1 GΩ or smaller. When the resistance change layers 31A and 32A are made of rear earth oxide, for example, the resistance values thereof are controllable by the thickness thereof or the amount of oxygen therein, for example.

In this example, the two resistance change elements 31 and 32 are electrically connected in series between the first and second electrodes 10 and 20, and show a change to the same resistance state relative to the voltage application. As such, based on the voltage application to the first and second electrodes 10 and 20, the resistance change elements 31 and 32 are decreased (low-resistance state; state of writing) or increased (high-resistance stare; state of erasing) in resistance value at the same time such that the resistance change elements 31 and 32 operate as a single element.

Note that it is the issue of definition which of the writing and erasing operations is related to which of the resistance states, i.e., low- or high-resistance. In this Specification, the low-resistance state is defined as the writing operation, and the high-resistance state is defined as the erasing operation.

Herein, the resistance change elements 31 and 32 both show a phenomenon of resistance value change not only by the voltage application to the first and second electrodes 10 and 20 as described above but also by any other factors such as heat and electric field. Such an unexpected resistance value change seems to occur at random to each of the resistance change elements 31 and 32 based on a certain probability distribution. Accordingly, when the resistance change elements 31 and 32 share the same probability distribution of resistance value change, the resistance change element 31 may show a large resistance value change but the remaining resistance change element 32 may show a small resistance value change. At this time, because the memory element 1 has the electrical characteristics specified for a higher resistance value, the change of resistance values between the first and second electrodes 10 and 20 is decreased. This thus improves the resistance distribution in the high-resistance state, thereby being able to increase a difference between the high- and low-resistance states (width of resistance separation). As such, if any resistance state intermediate between high and low is created through adjustment of an erasing voltage for a change of resistance state from low to high, for example, it means such an intermediate state is to be retained with a good stability. Accordingly, the resulting memory is capable not only of binary storage but also of multilevel storage.

In the below, described is a manufacturing method of the memory element 1 in the embodiment. Note that, in the description below, as shown in FIG. 3, exemplified is a case of manufacturing the memory element 1 in which the two resistance change elements 31 and 32 are provided at different positions on the same wafer, and are electrically connected in series between the first and second electrodes 10 and 20 via the intermediate electrodes 34A and 34B and the wiring 35.

First of all, on a substrate formed with a CMOS circuit such as selection transistor, the plugs of the first electrode 10 and the intermediate electrode 34B made of titanium nitride (TiN) are formed, for example.

Thereafter, by sputtering, for example, a gadolinium (Gd) film is formed with the thickness of 1.0 nm. Thereafter, this gadolinium (Gd) film is oxidized by oxygen plasma, thereby forming the resistance change layers 31A and 32A each made of gadolinium oxide (GdOx).

Thereafter, also by sputtering, for example, the ion source layers 31B and 32B are each made of CuZrTeAl with the thickness of 60 nm. As such, formed are the resistance change elements 31 and 32 including the resistance change layers 31A and 32A and the ion source layers 31B and 32B, respectively.

After forming the resistance change layers 31A and 32A and the ion source layers 31B and 32B as such, the ion source layers 31B and 32B are respectively formed thereon with the second electrode 20 and the intermediate electrode 34A made of tungsten (W), for example. As such, the substrate is formed thereon with a layered film including the lower electrode 10 and the intermediate electrode 34B, the resistance change layers 31A and 32A, the ion source layers 31B and 32B, and the second electrode 20 and the intermediate electrode 34A.

In such a layered film, the layers, i.e., the resistance change layers 31A and 32A, the ion source layers 31B and 32B, and the second electrode 20 and the intermediate electrode 34A, are subjected to patterning by plasma etching, for example. Other than plasma etching, any known etching method such as ion milling and RIE (Reaction Ion Etching) may be used for the patterning as such. After the patterning, the resulting layered film is subjected to a heat treatment.

Thereafter, the wiring 35 is connected between the intermediate electrodes 34A and 34B. As a result, the two resistance change elements 31 and 32 provided at different positions on the same wafer are electrically connected in series between the first and second electrodes 10 and 20 via the intermediate electrodes 34A and 34B and the wiring 35. As such, the memory element 1 of FIG. 3 is manufactured.

With such a manufacturing method, the memory element 1 of FIG. 3 was actually manufactured, and as for the resulting memory element 1, such a circuit as shown in FIG. 4A was configured to check the current-voltage characteristics. For the checking, as shown in FIG. 4B, the intermediate electrode 34B, the resistance change element 32, and the second electrode 20 were a first element 41, and the first electrode 10, the resistance change element 31, and the intermediate electrode 34A were a second element 42. To one end of the first element 41, an end of the second element 42 was connected via the wiring 35, and the other end of the first element 41 was connected with a source line 46. The other end of the second element 42 was connected with either the source or drain of a field-effect transistor 43. The source or drain of the field-effect transistor 43 not connected to the second element 42 was connected with a bit line 44, and the gate was connected with a word line 45. Herein, the field-effect transistor 43 was assumed as satisfying W/L=1.8 where W denotes the channel width, and L denotes the channel length. The bit line 44 was provided with a switch 47, and an ammeter 48.

Figure 5A:
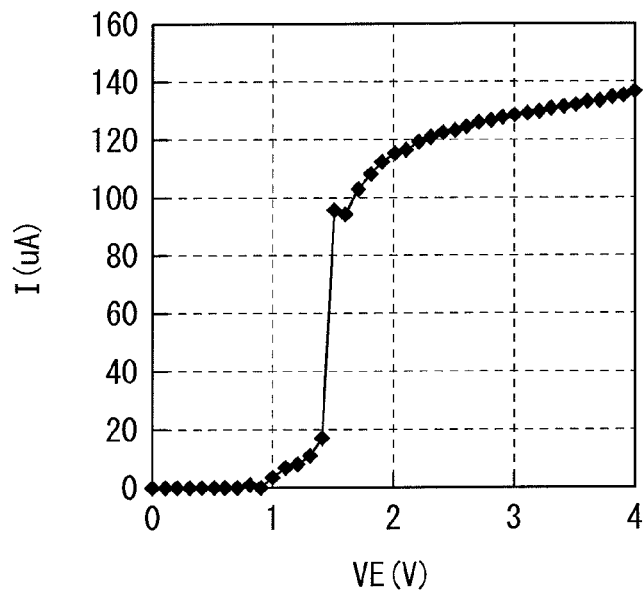
FIGS. 5A and 5B are each a diagram showing the result of an experiment on the current-voltage characteristics of the memory element of FIG. 3.
Figure 5B:
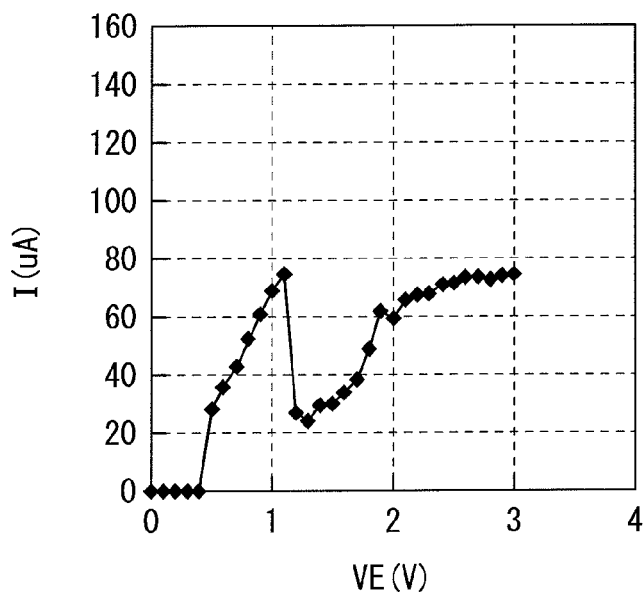

FIGS. 5A and 5B show the results of checking the current-voltage characteristics of the memory element 1 using the circuit of FIG. 4A. The measurement conditions for the setting (writing) side include VW=0 to 4 V and VGW=1.5 V, and those for the resetting (erasing) side include VE=0 to 3 V and VGE=3.5 V.

Herein, VW denotes a potential difference when a voltage is so applied that the source line is higher in potential than the bit line, and VGW denotes the potential of the word line. At this time, a current flows from the first element 41 toward the second element 42, and in the memory element 1, the resistance values are put in the state of low resistance. On the other hand, VE denotes a potential difference when a voltage is so applied that the source line is lower in potential than the bit line, and VGE denotes the potential of the word line. At this time, a current flows from the second element 42 toward the first element 41, and in the memory element 1, the resistance values are put in the state of high resistance.

The size parameter of the field-effect transistor 43 is W/L=1.8. Therefore, as the transistor characteristics, when the writing voltage VW is 3 V and the gate voltage VGW is 1.5 V, the memory element 1 is to be provided with a flow of current of about 130 µA. Moreover, in the course of erasing, when the erasing voltage VE is 2 V and the gate voltage VGE is 3.5 V, the memory element 1 is to be provided with a flow of current of about 130 µA.

In FIG. 5A, the current is abruptly increased in value when VW is about 1.5 V. This is due to the decrease of the resistance values as a result of the formation of a conductive path made of a metallic element to each of the resistance change layers 31A and 32A, and the first and second elements 41 and 42 are both through with setting (writing). Moreover, in FIG. 5B, the current is abruptly decreased in value when VE is about 1.1 V. This is due to the increase of the resistance values as a result of the disappearance of the conductive path in each of the resistance change layers 31A and 32A, and the first and second elements 41 and 42 are both through with resetting (erasing).

As such, if the two resistance change elements 31 and 32 are electrically connected in series between the first and second electrodes 10 and 20, the resistance change elements 31 and 32 are decreased or increased in resistance value at the same time in response to the voltage application to the first and second electrodes 10 and 20. As such, the resistance change elements 31 and 32 (first and second elements 41 and 42) are determined to be operable as a single element.

Figure 6:
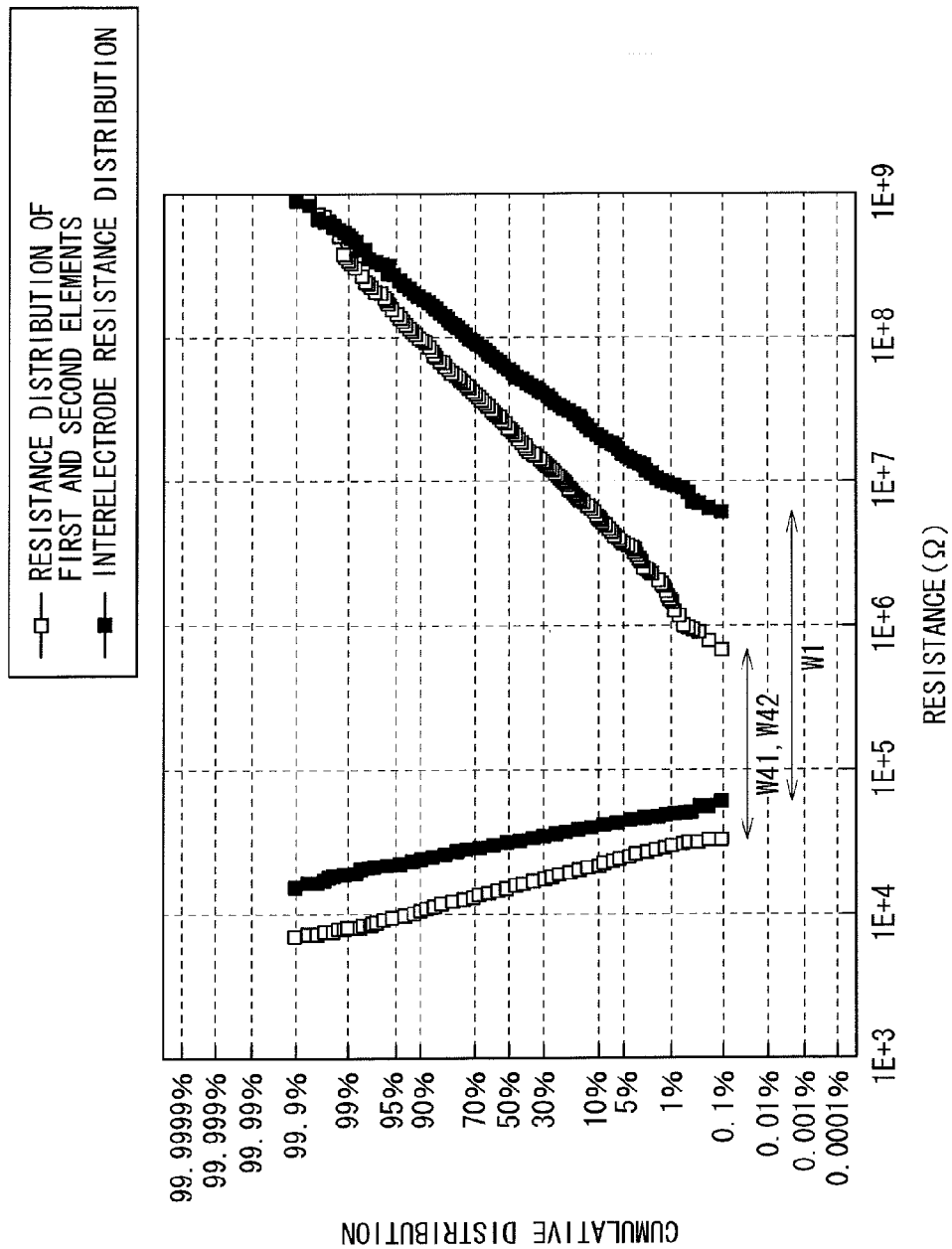
FIG. 6 is a diagram showing the calculation result of a distribution of resistance with 1 kbit.

FIG. 6 shows the calculation result of a distribution of resistance with 1 kbit. Assuming here is that the first and second elements 41 and 42 are the same, and share the same resistance distribution. The resistance distribution between the first and second electrodes 10 and 20 (resistance distribution of the memory element 1) is equal to the sum of the resistance distribution of the first element 41 and that of the second element 42. As such, as is known from FIG. 6, a resistance separation width W1 for the first and second electrodes 10 and 20 is wider than a resistance separation width W41 only for the first element 41 (or a resistance separation width W42 only for the second element 42). Therefore, the resistance distribution shows a larger margin, thereby favorably leading to a larger capacity.

As such, in the embodiment, the two resistance change elements 31 and 32 are electrically connected in series between the first and second electrodes 10 and 20 to change the resistance change elements 31 and 32 into the same resistance state relative to the voltage application. As such, by decreasing or increasing the resistance values of the resistance change elements 31 and 32 at the same time by the voltage application to the first and second electrodes 10 and 20, the resistance change elements 31 and 32 (first and second elements 41 and 42) become operatable as a single element, and the resistance distribution in the high-resistance state is to be improved. This thus allows the increase of the capacity with the improvement of the ability of information retention with a large number of bits.

Figure 7:
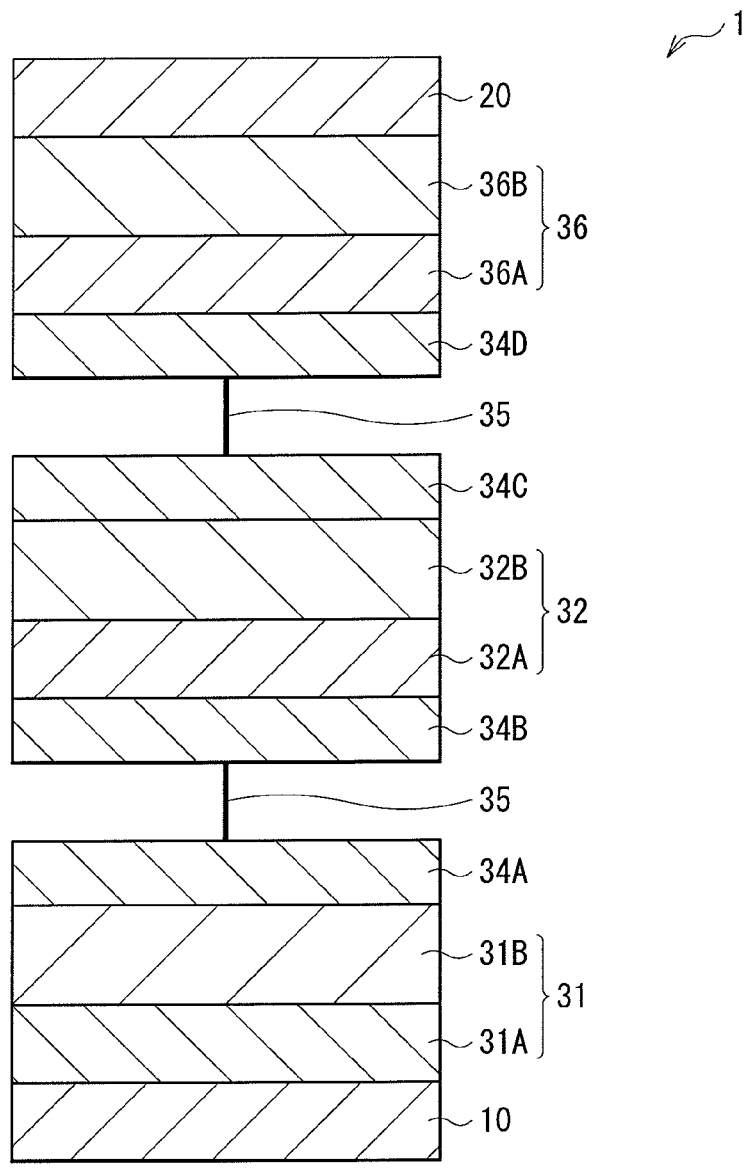
FIG. 7 is a cross-sectional view of a memory element in another modification.

Note that, in the embodiment described above, exemplified is the case of electrically connecting in series the two resistance change elements 31 and 32 between the first and second electrodes 10 and 20. The number of the resistance change elements is not restricted to two, and three resistance change elements 31, 32, and 36 as shown in FIG. 7 or more may be electrically connected in series.

Second Embodiment

Figure 8:
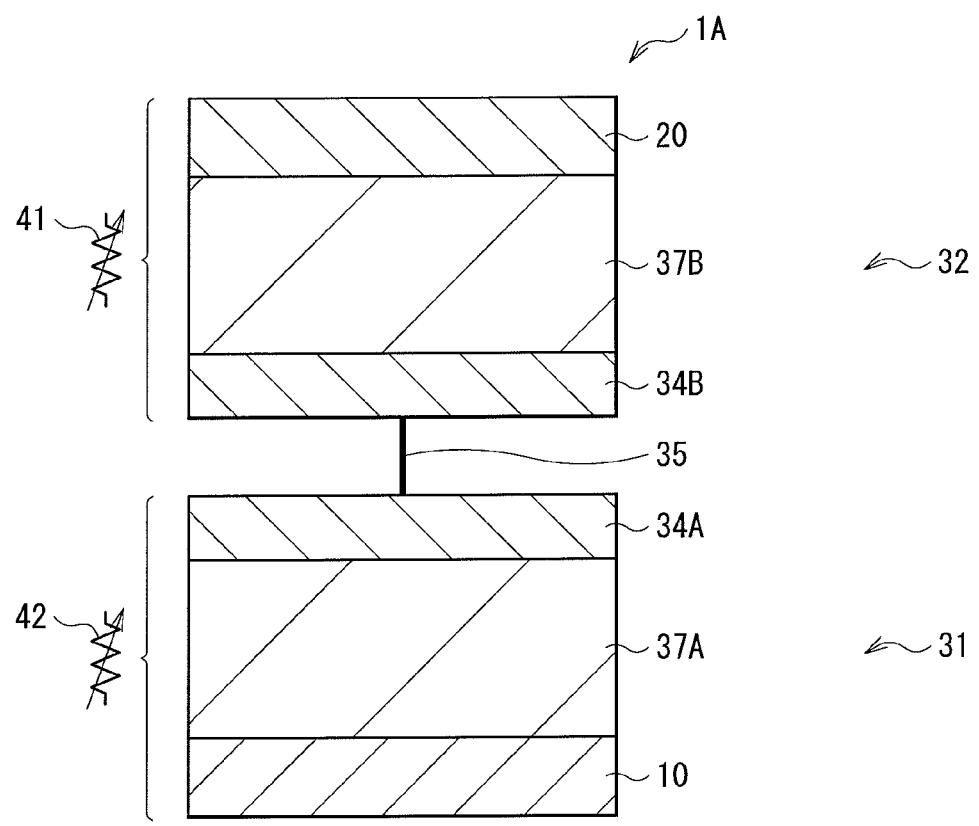
FIG. 8 is a cross-sectional view of a memory element in a second embodiment of the present disclosure, showing the configuration thereof.

FIG. 8 is a diagram showing the configuration of a memory element 1A in a second embodiment of the present disclosure. This memory element 1A is in the same configuration with the same effects and advantages as the memory element 1 in the first embodiment described above except that the resistance change elements 31 and 32 are each being a PCM, and is manufactured similarly to the memory element 1 in the first embodiment. Therefore, in the memory element 1A, any corresponding component is provided with the same reference numeral as that in the memory element 1 for a description.

Similarly to the memory element 1 in the first embodiment, the memory element 1A includes a plurality of (two in FIG. 8 example) resistance change elements 31 and 32 between the first electrode (lower electrode) 10 and the second electrode (upper electrode) 20.

The resistance change elements 31 and 32 are PCMs respectively including resistance change layers 37A and 37B made of GeSbTe alloy such as $Ge_2Sb_2Te_5$. The resistance change layers 37A and 37B show a phase change between the states of crystalline and amorphous in response to application of a current, and based on this phase change, their resistance values show a reversible change. Similarly to the first embodiment, these resistance change elements 31 and 32 are electrically connected in series between the first and second electrodes 10 and 20, and are changed to the same resistance state relative to the voltage application. As such, similarly to the first embodiment, in the memory element 1A, this allows the increase of the capacity with the improvement of the resistance distribution in the high-resistance state.

Similarly to the first embodiment, the resistance change elements 31 and 32 are electrically connected in series by the intermediate electrodes 34A and 34B respectively provided thereto, and by the wiring 35 connected between the intermediate electrodes 34A and 34B. Alternatively, similarly to the first embodiment, the resistance change elements 31 and 32 may be disposed one on the other with the diffusion prevention layer 33 (refer to FIG. 1) provided therebetween.

With such a memory element 1A, when a current pulse is applied by a power source (pulse application unit; not shown) via the first and second electrodes 10 and 20, the resistance change layers 37A and 37B of the resistance change elements 31 and 32 are changed in state from amorphous with a high resistance to crystalline with a low resistance (or from crystalline with a low resistance to amorphous with a high resistance). By repeating such a procedure, the memory element 1A is to be subjected to repeated writing of information and erasing of the written information.

In this second embodiment, similarly to the first embodiment, the two resistance change elements 31 and 32 are electrically connected in series between the first and second electrodes 10 and 20, and show a change to the same resistance state relative to the voltage application. As such, in response to application of a current to the first and second electrodes 10 and 20, the resistance change elements 31 and 32 are decreased (low-resistance state; state of writing) or increased (high-resistance stare; state of erasing) in resistance value at the same time such that the resistance change elements 31 and 32 operate as a single element.

Also similarly to the first embodiment, even when the resistance change elements 31 and 32 show a phenomenon of resistance value change due to any factors such as heat and electric field, because the memory element 1A has the electrical characteristics specified for a higher resistance value, the change of resistance values between the first and second electrodes 10 and 20 is decreased. This thus improves the resistance distribution in the high-resistance state, thereby being able to increase a difference between the high- and low-resistance states (width of resistance separation). As such, if any resistance state intermediate between high and low is created through adjustment of an erasing voltage for a change of resistance state from low to high, for example, it means that such an intermediate state is to be retained with a good stability. Accordingly, the resulting memory is capable not only of binary storage but also of multilevel storage.

Third Embodiment

Figure 9:
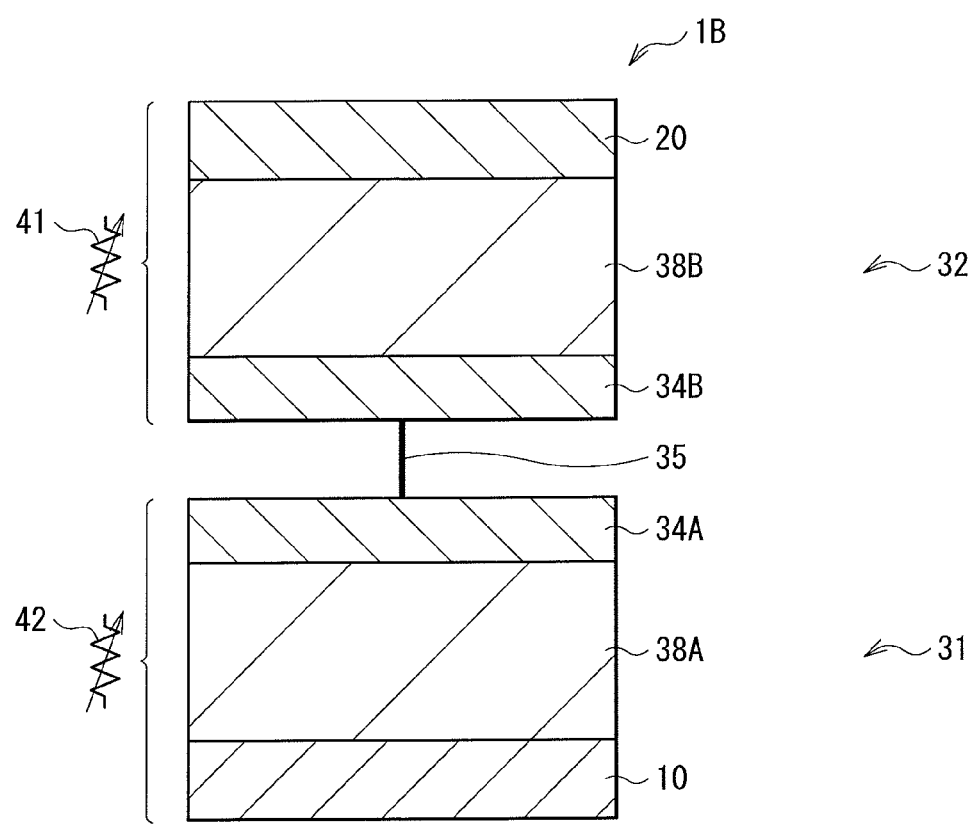
FIG. 9 is a cross-sectional view of a memory element in a third embodiment of the present disclosure, showing the configuration thereof.

FIG. 9 is a diagram showing the configuration of a memory element 1B in a third embodiment of the present disclosure. This memory element 1B is in the same configuration with the same effects and advantages as the memory element 1 in the first embodiment described above except that the resistance change elements 31 and 32 are each being an ReRAM, and is manufactured similarly to the memory element 1 in the first embodiment. Therefore, in the memory element 1B, any corresponding component is provided with the same reference numeral as that in the memory element 1 for a description.

Similarly to the memory element 1 in the first embodiment, the memory element 1B includes a plurality of (two in FIG. 9 example) resistance change elements 31 and 32 between the first electrode (lower electrode) 10 and the second electrode (upper electrode) 20.

The resistance change elements 31 and 32 are ReRAMs respectively including resistance change layers 38A and 38B made of an oxide such as NiO, $TiO_2$, $PrCaMnO_3$, or others. The resistance values of the resistance change layers 38A and 38B show a reversible change in response to application of a voltage to the oxide. Similarly to the first embodiment, these resistance change elements 31 and 32 are electrically connected in series between the first and second electrodes 10 and 20, and show a change to the same resistance state relative to the voltage application. As such, similarly to the first embodiment, this allows the increase of the capacity with the improvement of the resistance distribution in the high-resistance state.

Similarly to the first embodiment, the resistance change elements 31 and 32 are electrically connected in series by the intermediate electrodes 34A and 34B respectively provided thereto, and by the wiring 35 connected between the intermediate electrodes 34A and 34B. Alternatively, similarly to the first embodiment, the resistance change elements 31 and 32 may be disposed one on the other with the diffusion prevention layer 33 (refer to FIG. 1) provided therebetween.

With such a memory element 1B, when a voltage is applied from a power source (pulse application unit; not shown) via the first and second electrodes 10 and 20, the resistance change layers 38A and 38B of the resistance change elements 31 and 32 are changed in resistance state from high to low (or from low to high). By repeating such a procedure, the memory element 1B is to be subjected to repeated writing of information and erasing of the written information.

In this third embodiment, similarly to the first embodiment, the two resistance change elements 31 and 32 are electrically connected in series between the first and second electrodes 10 and 20, and show a change to the same resistance state relative to the voltage application. As such, in response to application of a current pulse to the first and second electrodes 10 and 20, the resistance change elements 31 and 32 are decreased (low-resistance state; state of writing) or increased (high-resistance stare; state of erasing) in resistance value at the same time such that the resistance change elements 31 and 32 operate as a single element.

Also similarly to the first embodiment, even when the resistance change elements 31 and 32 both show a phenomenon of resistance value change due to any factors such as heat and electric field, because the memory element 1B has the electrical characteristics specified for a higher resistance value, the change of resistance values between the first and second electrodes 10 and 20 is decreased. This thus improves the resistance distribution in the high-resistance state, thereby being able to increase a difference between the high- and low-resistance states (width of resistance separation). As such, if any state intermediate between high and low is created through adjustment of an erasing voltage for a state change from low to high, for example, it means such an intermediate state can be retained with a good stability. Accordingly, the resulting memory is capable not only of binary storage but also of multilevel storage.

(Memory Device)

Figure 10:
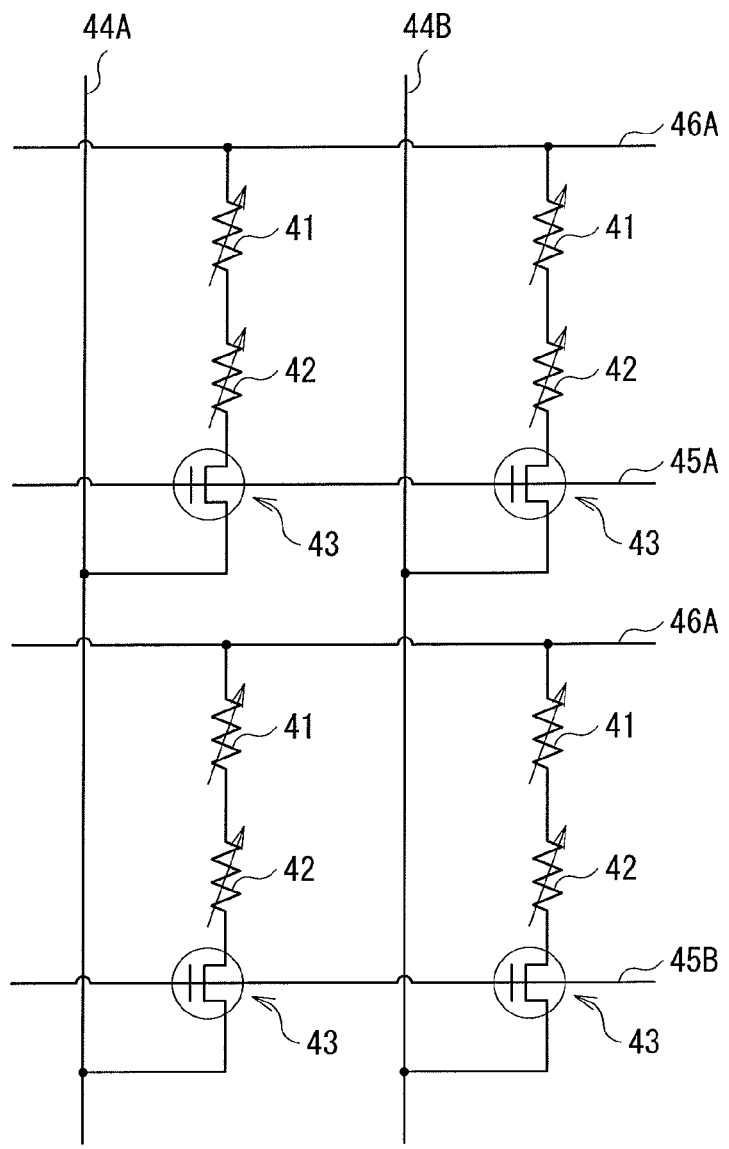
FIG. 10 is a circuit diagram of a memory device, showing an exemplary circuit configuration thereof.

By arranging plurally the memory elements 1, 1A, and 1B described above in rows or in a matrix, for example, a memory device (memory) can be configured. At this time, as necessary, the memory elements 1, 1A, and 1B are each connected with a MOS transistor for element selection use or with a diode to configure a memory cell. FIG. 10 shows the specific schematic circuit diagram in a memory device. This is 4-bit (2×2) memory device available for binary storage of information with a MOS transistor serving as a selection element. This memory device may be connected to a sense amplifier, an address decoder, circuits of writing, erasing, and reading, and others by wiring.

The memory device of the embodiments is applicable to various types of memory devices as described above. For example, the memory device is applicable for use with any types of memories such as once-writable PROM (Programmable Read Only Memory), electrically erasable EEPROM (Erasable Programmable Read Only Memory), or so-called RAM available for high-speed writing, erasing, and reproduction.

While the present disclosure has been described in detail, the foregoing description is in all aspects illustrative and not restrictive. It is understood that numerous other modifications and variations can be devised.

For example, the materials of the layers, the film-forming methods and conditions, and others described in the embodiments above are surely not restrictive, and any other materials, or any other film-forming methods will also do. In the first embodiment, for example, the ion source layers 31B and 32B may be each added with any other transition metallic elements, e.g., titanium (Ti), hafnium (Hf), vanadium (V), niobium (Nb), tantalum (Ta), chromium (Cr), molybdenum (Mo), or tungsten (W). Moreover, other than copper (Cu), silver (Ag), and zinc (Zn), nickel (Ni) or others may be also added.

Furthermore, for example, in the embodiments described above, the configuration of the memory element 1 and that of the memory device (memory cell array) are specifically described. However, all of the layers are not necessarily provided, or any other layers may be also provided.

The present disclosure contains subject matter related to that disclosed in Japanese Priority Patent Application JP 2010-153771 filed in the Japan Patent Office on Jul. 6, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory element, comprising:
   first and second electrodes; and
   a plurality of resistance change elements (i) electrically connected in series between the first and second electrodes, and (ii) each having a resistance value,
   wherein,
   the resistance value of each of the resistance change elements is (i) reversibly changeable in response to a voltage applied to the first and second electrodes, and (ii) changeable to a same resistance state relative to the voltage applied to the first and second electrodes, and
   the resistance change elements are layered and electrically connected in series to each other by (i) a wire extending therebetween, or (ii) a diffusion prevention layer disposed to entirely cover opposing surfaces of the resistance change elements.

2. The memory element according to claim 1, wherein:
   each of the resistance change elements include (i) an ion source layer including at least one chalcogen element selected from tellurium (Te), sulfur (S), and selenium (Se), and an ionizable metallic element, and (ii) a resistance change layer made of a material having a resistance value higher than a resistance value of the ion source layer.

3. The memory element according to claim 2, wherein:
   the ion source layer includes one or both of copper (Cu) and zirconium (Zr) as the ionizable metallic element.

4. The memory element according to claim 3, wherein:
   each of the resistance change elements are decreased in resistance value by formation of a conductive path including one or both of copper (Cu) and zirconium (Zr) in the resistance change layer by the voltage application to the first and second electrodes.

5. The memory element according to claim 1, wherein:
   the resistance change elements are electrically connected in series by intermediate electrodes, the wire connected between the intermediate electrodes.

6. The memory element according to claim 1, wherein:
the plurality of the resistance change elements operate as a single element by decreasing or increasing the resistance values of the resistance change elements at a same time.

7. The memory element according to claim 1, wherein:
the resistance value of each of the resistance change elements is changed from low resistance to high resistance when the voltage is applied to the first and second electrodes.

8. The memory element according to claim 1, wherein:
the resistance value of each of the resistance change elements is changed from high resistance to low resistance when the voltage is applied to the first and second electrodes.

9. A method of driving a memory element including first and second electrodes, and a plurality of resistance change elements (i) electrically connected in series between the first and second electrodes, and (ii) each having a resistance value, the method comprising:
functioning the plurality of the resistance change elements as a single element by decreasing or increasing the resistance values of the resistance change elements at a same time by application of a voltage to the first and second electrodes,
wherein,
the resistance value of each of the resistance change elements is (i) reversibly changeable in response to the voltage applied to the first and second electrodes, and (ii) changeable to a same resistance state relative to the voltage applied to the first and second electrodes, and
the resistance change elements are layered and electrically connected in series to each other by (i) a wire extending therebetween, or (ii) a diffusion prevention layer disposed to entirely cover opposing surfaces of the resistance change elements.

10. A memory device, comprising:
a plurality of memory elements; and
a pulse application unit configured to selectively apply a voltage or current pulse to the memory elements,
wherein,
each of the memory elements include (i) first and second electrodes and (ii) a plurality of resistance change elements electrically connected in series between the first and second electrodes,
each of resistance change elements have a resistance value (i) reversibly changeable in response to application of a voltage to the first and second electrodes, and (ii) changeable to the same resistance state relative to the voltage application, and
the resistance change elements are layered and electrically connected in series to each other by (i) a wire extending therebetween, or (ii) a diffusion prevention layer disposed to entirely cover opposing surfaces of the resistance change elements.

* * * * *